(12) United States Patent
Stein

(10) Patent No.: US 8,846,419 B2
(45) Date of Patent: Sep. 30, 2014

(54) THIN LAYER SOLAR CELL MODULE AND METHOD FOR PRODUCING IT

(71) Applicant: Wilhelm Stein, Dresden (DE)

(72) Inventor: Wilhelm Stein, Dresden (DE)

(73) Assignee: Wilhelm Stein, Dresden (DE)

( * ) Notice: Subject to any disclaimer, the term of this patent is extended or adjusted under 35 U.S.C. 154(b) by 0 days.

(21) Appl. No.: 13/926,885

(22) Filed: Jun. 25, 2013

(65) Prior Publication Data

US 2013/0284231 A1 Oct. 31, 2013

Related U.S. Application Data

(60) Division of application No. 12/684,474, filed on Jan. 8, 2010, now Pat. No. 8,470,615, which is a continuation of application No. PCT/EP2008/058864, filed on Jul. 8, 2008.

(30) Foreign Application Priority Data

Jul. 11, 2007 (DE) .......................... 10 2007 032 283

(51) Int. Cl.
| | |
|---|---|
| H01L 31/042 | (2014.01) |
| H01L 21/18 | (2006.01) |
| H01L 27/142 | (2014.01) |
| H01L 31/0392 | (2006.01) |
| H01L 31/18 | (2006.01) |
| H01L 31/0224 | (2006.01) |

(52) U.S. Cl.
CPC ......... *H01L 31/042* (2013.01); *H01L 31/02245* (2013.01); *H01L 27/1423* (2013.01); *H01L 31/0392* (2013.01); *Y02E 10/50* (2013.01); *H01L 27/1426* (2013.01); *H01L 31/18* (2013.01)
USPC .......................................................... 438/19

(58) Field of Classification Search
CPC .. H01L 31/02245; H01L 31/18; H01L 21/677
USPC .......................................................... 438/19
See application file for complete search history.

(56) References Cited

U.S. PATENT DOCUMENTS

| | | | |
|---|---|---|---|
| 4,726,849 A * | 2/1988 | Murata et al. ................. | 136/244 |
| 4,746,618 A | 5/1988 | Nath et al. | |
| 4,758,526 A | 7/1988 | Thalheimer | |
| 4,873,201 A | 10/1989 | Grimmer et al. | |
| 4,879,251 A | 11/1989 | Kruehler et al. | |
| 5,348,589 A | 9/1994 | Arai et al. | |
| 5,453,134 A | 9/1995 | Arai et al. | |

(Continued)

FOREIGN PATENT DOCUMENTS

| | | |
|---|---|---|
| DE | 3727826 A1 | 3/1989 |
| DE | 19651655 C2 | 1/1998 |

(Continued)

*Primary Examiner* — William D Coleman
(74) *Attorney, Agent, or Firm* — Slater & Matsil, L.L.P.

(57) ABSTRACT

A process can be used for producing a thin layer solar cell module with a plurality of segments that are electrically connected in series and arranged on a common substrate. The process has steps for application of layers onto the substrate to form at least one electrode and one photoactive layer sequence and has steps for structuring the applied and/or to be applied layers to form the plurality of segments. At least one electrode and one photoactive layer sequence are applied before structuring steps are carried out.

19 Claims, 7 Drawing Sheets

(56) References Cited

U.S. PATENT DOCUMENTS

| | | | |
|---|---|---|---|
| 5,468,974 A | 11/1995 | Aronowitz et al. | |
| 6,268,558 B1 | 7/2001 | Kubota | |
| 6,323,056 B1 | 11/2001 | Miyoshi | |
| 6,426,235 B1 | 7/2002 | Matsushita et al. | |
| 6,578,764 B1 | 6/2003 | Hiraishi et al. | |
| 2003/0044539 A1 | 3/2003 | Oswald | |
| 2006/0278497 A1 | 12/2006 | White et al. | |
| 2006/0280588 A1 | 12/2006 | Blonigan et al. | |
| 2007/0123005 A1 | 5/2007 | Hiura et al. | |
| 2007/0205400 A1 | 9/2007 | Kato et al. | |
| 2007/0205462 A1 | 9/2007 | Kato et al. | |
| 2008/0268560 A1 | 10/2008 | Ploessl et al. | |

FOREIGN PATENT DOCUMENTS

| | | |
|---|---|---|
| DE | 10050577 A1 | 4/2001 |
| EP | 0320089 A2 | 6/1989 |
| EP | 1089346 A2 | 4/2001 |
| GB | 1575888 A | 10/1980 |
| JP | 63-283077 A | 11/1988 |
| JP | 05-183177 A | 7/1993 |
| JP | 2000-058886 A | 2/2000 |
| JP | 2006-222384 A | 8/2006 |
| JP | 2007-119911 A | 5/2007 |
| JP | 2008-544485 | 12/2008 |
| WO | WO0007249 A1 | 2/2000 |
| WO | WO2005024920 A1 | 3/2005 |

* cited by examiner

PRIOR ART

THIN LAYER SOLAR CELL MODULE AND METHOD FOR PRODUCING IT

This application is a divisional of U.S. application Ser. No. 12/684,474, filed Jan. 8, 2012 and now U.S. Pat. No. 8,470,615, which is a continuation of International Application No. PCT/EP2008/058864, filed Jul. 8, 2008, which claims priority to German Application No. 10 2007 032 283.8 filed Jul. 11, 2007. All of these applications are incorporated herein by reference.

TECHNICAL FIELD

Embodiments of the invention concern a method for producing a thin layer solar cell module with a plurality of electrically series-connected segments arranged on a common substrate. Other embodiments concern the corresponding thin layer solar cell modules and a production line that is suitable for conducting the production process.

BACKGROUND

Thin layer solar cell modules, also called thin layer photovoltaic modules, have photoactive layers with thicknesses in the range of micrometers. The semiconductor material that is used in the photoactive layer or layers can be amorphous or microcrystalline. A combination of layers of amorphous and microcrystalline semiconductor material within a cell is also possible, for example, with the so-called tandem cells and the so-called triple cells. Possibilities for semiconductor materials are Si and Ge and compound semiconductors like CdTe or $Cu(In, Ga)Se_2$ (abbreviated CIS or CIGS). In spite of a somewhat lower efficiency than layer solar cell modules, because of their clearly lower material requirements, thin layer solar cell modules represent an economical and technically relevant alternative to solar cell modules that are produced on the basis of single-crystal or polycrystalline semiconductor layers of macroscopic thicknesses.

To be able to use economic modules with a surface area that is as high as possible, without the current laterally discharged in the electrodes of the solar cells becoming so great that high ohmic losses arise, thin layer solar cell modules are usually divided into a plurality of segments. The strip shaped segments, which as a rule are a few millimeters to centimeters wide, mostly run parallel to one edge of the module. The segments formed in that individual layer of the layer structure of the solar cell are interrupted by thin separating lines with a continuous substrate. The separating lines lead, for one thing, to like layers of adjacent segments being electrically isolated from each other and, for another, to the fact that subsequently applied layers can be electrically connected to underlying layers along a contact line. With the appropriate arrangement of the separating lines a serial connection of the individual segments can in this way be achieved.

According to the prior art the formation of a separating line takes place in each case immediately after application of the layer. Since the application of layers usually takes place under vacuum conditions, but the formation of the separating lines usually takes place spatially separately under atmospheric conditions, the production process according to the prior art requires a complicated process setup. In addition, with the frequent loading and unloading operations in and out of the vacuum there is the danger of incorporating contaminants between the layers of a solar cell. Material removed during the structure-producing operations that settles on the layers can also be such a contaminant.

SUMMARY

In one aspect, the invention provides a method for producing a thin layer solar cell module that allows a simpler and more efficient conduct of the process. In other aspects the invention specifies a thin layer solar cell module that can be produced in such a process and to create a production line for producing such a thin layer solar cell module.

According to a first aspect of the invention the task is solved by a method for producing a thin layer solar cell module with a plurality of segments that are arranged on a common substrate and electrically connected in series, where the process includes steps for application of layers onto the substrate to form at least one electrode and one photoactive layer sequence and steps for structuring the applied and/or to be applied layers in order to form the plurality of segments. At least one electrode and one photoactive layer sequence are applied before structuring steps are carried out.

Therefore, initially a group of at least two processes for deposition of layers is carried out before structuring steps for segmentation are carried out. The combining of process steps that are each carried out under comparable conditions (for example, vacuum versus atmospheric conditions) facilitates the conduct of the process and is suitable for reducing the incorporation of contaminants between the layers in the case of thin layer solar cell modules.

In an advantageous embodiment of the process the structuring of already applied layers takes place by creating a separating line by means of a laser beam and/or by mechanical scoring and/or selective etching. Especially preferably, laser radiation is directed so that one or more layers are locally removed or that one or more layers are locally heated so that the physical properties of at least one of the layers, in particular, its conductivity, is changed.

In another advantageous embodiment of the process the structuring of already applied layers takes place by creating a contact line through laser radiation. Especially preferably, laser radiation is directed so that layers of different material lying one on the other are locally heated and a material compound that has physical properties that differ from the original materials and, in particular, is conductive is formed.

In another advantageous embodiment of the process an isolating line of an electrically isolating material is created within one of the separating lines. Especially preferably, the isolating line is applied by an ink jet printing process.

According to another advantageous embodiment of the process a structuring of layers to be brought together subsequently takes place with the help of a cover line of a soluble material. Especially preferably, the cover line is applied by an ink jet printing process.

The advantageous embodiments of the process according to the first aspect of the invention specifies structuring measures that are suitable for conducting a structuring of a (single) layer even within a layer stack having at least two layers applied one on the other. They are therefore ideal structuring measures for the method in accordance with this application.

According to a second aspect of the invention the task is solved by a thin layer solar cell module with a plurality of segments that are electrically connected in series that is produced by a method as described herein.

According to a third aspect of the invention the task is solved by a thin layer solar cell module with a plurality of segments that are electrically connected in series, in which an isolating line of an isolating material is applied in the region of a separating line, which interrupts a first electrode of the thin layer solar cell module for the formation of the segments and which is covered with a second electrode. Preferably, the isolating line contains an isolating polymer.

According to a fourth aspect of the invention the task is solved by a thin layer solar cell module with a plurality of segments electrically connected in series, in which an electrode of an electrically conductive oxide that is turned toward the substrate is electrically interrupted by a separating line, where the electrode locally in the region of the separating line has different physical properties than outside the separating line.

Preferably, the locally different physical properties in the region of the separating line derive from a change of doping after recrystallization of the electrode in the region of the separating line or formation of an oxide of an element from a photoactive layer sequence adjacent to the electrode in the region of the separating line. Especially preferably, the photoactive layer sequence contains Si and the separating line contains Si oxide.

According to a fifth aspect of the invention the task is solved by a thin layer solar cell module with a plurality of segments electrically connected in series including a first electrode, a photoactive layer sequence and a second electrode, in which there is a contact line via which the second electrode is electrically connected to the first electrode for series connection of the segments, where the contact line contains, in the region of the photoactive layer sequence, a conductive material compound and/or a conductive alloy of elements of the photoactive layer sequence and the second electrode. Preferably, the photoactive layer sequence contains Si and the contact line contains a silicide.

According to a sixth aspect of the invention the task is solved by a thin layer solar cell module with a plurality of segments electrically connected in series, in which an electrically conductive adhesive strip or a strand of a conductive paste is applied in the region of a separating line that interrupts a first electrode of the thin layer solar cell module for formation of the segments, and a second electrode for restoration of the electrical connection to the second electrode.

In the thin layer solar cell modules in accordance with the second through sixth aspects of the invention, the different layers (electrodes and photoactive layer sequence) are structured so that a series connection can be created after at least two layers have already been applied. The combining of the process steps for application of the layers results in lesser contamination, in the thin layer solar cell modules, for example, due to frequent loading and unloading processes, and thus it results in better layer quality, from which higher efficiency of the cells results. Moreover, in the case of these thin layer solar cell modules the process steps for structuring of the layers can be combined, which leads to better positioning of the structuring steps in the different layers with respect to each other. This results in a small contact area for the series connection and consequently a higher surface area yield on the part of the cells.

According to a seventh aspect of the invention the task is solved by a production line for producing a thin layer solar cell module on a glass substrate, in which, with a coating plant that has a first vacuum lock, at least two coating stations and a second vacuum lock and is designed so that the glass substrate, after being loaded into the coating plant through the first vacuum lock can pass through the minimum of two coating stations in a succession under vacuum conditions, before the substrate is discharged from the coating plant through the second vacuum lock.

BRIEF DESCRIPTION OF THE DRAWINGS

The invention will be explained in more detail by means of embodiment examples using five figures.

Figure 1:
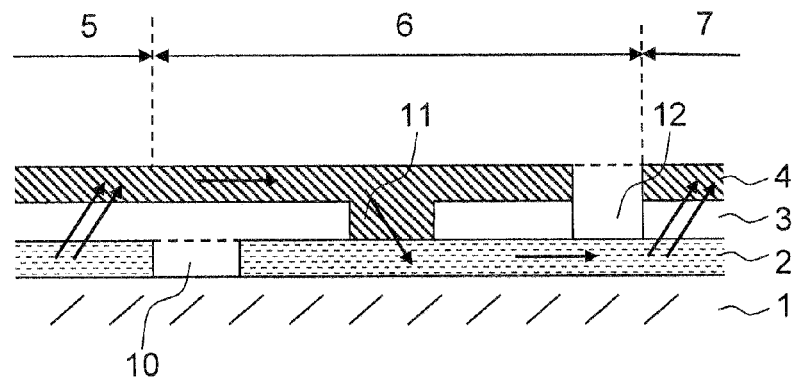
FIG. 1 shows a schematic representation of a layer structure of a thin layer solar cell module according to the prior art.

The following list of reference symbols may be used in conjunction with the drawings:

1 Substrate
2 First electrode (front side electrode)
3 Photoactive layer sequence
4 Second electrode (back side electrode)
5 First segment
6 Contact region
7 Second segment
10, 11, 12 Separating lines
20, 21 Separating lines
22 Isolating line
23 Cover line
24-26 Separating lines
24-26 Separating line
30 Contact line
31 Separating line
32 Separating line
30 Contact line
41 Separating line
42 Conductive adhesive strip
43 Conductive strand
50 First transport system
51 Glass substrate
52 Cleaning station
53 First vacuum lock
54 Coating plant
55 Second transport system
56 First PVD/(LP)CVD coating station
57 PECVD coating station
58 Second PVD/(LP)/CVD coating station
59 Second vacuum lock
60 Third transport system
61 Structuring device
62 Process head
63 Thin layer solar cell base module

DETAILED DESCRIPTION OF ILLUSTRATIVE EMBODIMENTS

FIG. 1 shows the layer structure of a thin layer solar cell module according to the prior art in a schematic representation. A first electrode 2, a photoactive layer sequence 3 and a second electrode 4 are applied to a substrate 1. The first electrode 2, the photoactive layer sequence 3 and the second electrode 4 are laterally interrupted by separating lines 10, 11 and 12. The three separating lines 10, 11 and 12 are in turn laterally spaced apart and divide the represented segment of the thin layer solar cell module into a first segment 5 to the left of separating line 10, a second segment 7 to the right of separating line 12 and a contact region 6 lying between them.

Usually in thin layer solar cell modules the electrodes 2 and 4 and the photoactive layer sequence 3 are applied in vacuum processes. Suitable for this are PVD processes (physical vapor deposition), for example, plasma sputtering or electron beam evaporation, or also CVD processes (chemical vapor deposition), for example, LPCVD (low pressure CVD) or PECVD (plasma enhanced CVD).

Amorphous or microcrystalline semiconductors of group IV, for example, a-Si, a-SiGe, µC—Si, or compound semiconductors such as CdTe or Cu(In, Ga)Se$_2$ (abbreviated CIS or CIGS) can be used as the active semiconductor material for the photoactive layer sequence 3. Layers of materials different from those indicated above can also be combined in the photoactive layer sequence 3. In addition, partially reflecting layers (intermediate reflectors) of a conductive oxide and/or a conductive semiconductor layer can be present in the photoactive layer sequence 3.

The photoactive layer sequence 3 typically includes at least one p- and one n-doped semiconductor layer, i.e., a diode junction. In the case of thin layer solar cells based on silicon, the p- and the n-doped layers are usually additionally separated by an extended intrinsic layer (i-layer). For better utilization of the wavelength spectrum a number of pin-layer stacks with different absorption spectra can be provided one on top of the other. The Si tandem cell preferably has a pin-layer stack of a-Si and a pin-layer stack of µC—Si and in the Si triple cell there is additionally a pin-layer stack of a-Si(Ge). In this connection it is expressly pointed out that within the scope of this application the photoactive layer sequence 3 is not limited to a pin-layer or nip-layer stack (diode junction), but includes multiple stacks like those of tandem or triple cells.

Typically the p-doped layer is turned toward the sun. With reference to the production process, a differentiation is made between the so-called pin-cells and nip-cells depending on the sequence in which the differently doped layers of the photoactive layer sequence 3 are applied. In the case of pin-cells the (growth) substrate 1 is transparent and in the end module also forms the carrier substrate that is turned toward the sun. Typically (sheet) glass is used for this. In the case of nip-cells, glass or even a (metal) film can be used as growth substrate. The carrier substrate, through which sunlight passes in operation, is not laminated onto the module until the end of the production process. The nip-layer stack remains bonded to the growth substrate.

All of the embodiment examples that are presented show pin-cells. This is purely a matter of example and does not represent any limitation. All of the processes described within the scope of this application can be used both in the case of pin-cells and nip-cells.

In the example of a pin-cell shown in FIG. 1 the first electrode 2, which is turned toward the sun and which in what follows is also called the front side electrode, is usually formed of transparent conductive oxides (TCO), for example, SnO$_2$ or ZnO or ITO (indium tin oxide). The second electrode 4, which is turned away from the sun and is also called the back side electrode in what follows, can likewise have a TCO layer or also can be formed by metals like Ag, Al, Mo, or from a combination of TCO and a metal layer.

If the process described in the application is extended to nip cells one should note that the function of electrodes 2 and 4 is correspondingly reversed. The first electrode 2, which is applied first, can in the case of a nip cell include a metal layer and be the back side electrode turned away from the sun in operation. Correspondingly, the last applied second electrode 4 is made transparent and forms the front side electrode turned toward the sun.

In the process of producing the thin layer solar cell modules according to the prior art that is shown in FIG. 1 the front side electrode 2, for example, TCO, is applied to the substrate 1, for example glass, first. Then the separating line 10 is produced in the front side electrode 2 by laser light of an appropriate wavelength, for example, 1064 nm, or by mechanical scoring or by selective etching. This separating line 10 runs over the entire width of the module (in the figure perpendicular to the plane of the paper). The laser light can be directed both through substrate 1 and also from the layer side. The separating line 10 separates electrodes 2 over their entire thickness to a width of 5-1000 µm, with typical widths lying in the range of 10-50 µm. After structuring of the front side electrode 2 is complete, the photoactive layer sequence 3 is applied and then structured by generating the separating line 11. Separating line 11 in photoactive layer sequence 3 is usually generated by laser light at a wavelength of 532 nm if Si is used as the photoactive material. Finally, the back side electrode 4 is applied; it comes into direct contact with the front side electrode 2 in the region of separating line 11. The separating line 12 is generated in a last step in order to separate the back side electrode 4 of the first segment 5 electrically from the back side electrode 4 of the second segment 7. It is conventional here to direct laser light through the substrate 1 at a wavelength that is not absorbed by the front side electrode 2, but is absorbed by the photoactive layer sequence 3, thus again 532 nm, for example, so that the photoactive layer sequence 3 evaporates, and the metal back side electrode 4 can melt and be jettisoned in the region of separating line 12 or even can in turn evaporate. The alternating steps for application of the layers and for structuring the layers lead to a series connection of the two segments 5 and 7 as is evident by the arrow symbolizing the flow of current in FIG. 1.

From the standpoint of process technology there is the problem that steps for layer deposition that take place in a vacuum alternate with structuring steps, for the formation of separating lines 10, 11 and 12, which take place under atmospheric conditions (ambient air or even a protective gas atmosphere) and in an entirely different process station. Besides the elevated expenditure in the conduct of the process, the correspondingly frequently necessary loading and unloading operations carry the danger that contaminants will be deposited between the layers.

In addition, with thin layer solar cells it is desirable to make the contact region 6 as narrow as possible, since it is an inactive area, which reduces the surface area yield of the solar cell module. The separate structuring processes, between which the substrate moreover is sent to other process chambers to apply the layers, necessarily leads to a lack of precision in positioning the separating lines 10, 11 and 12 with respect to each other. As a consequence the spacing of separating lines 10, 11 and 12 from each other must a priori be chosen to be so wide that the unavoidable positioning error will be harmless for the correct conduct of the series connection of the segments.

FIG. 2 illustrates a first embodiment example of a process in accordance with the invention for producing a thin layer solar cell module.

Figure 2A:
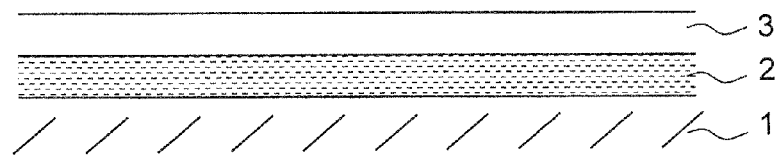
FIGS. 2a-4f show schematic representations of the layer structure of thin layer solar cell modules, each for different process stages in a process in accordance with the application.

As FIG. 2a shows, first a first electrode 2 and a photoactive layer sequence 3 are applied to a substrate 1. As an example, substrate 1 is sheet glass, the first electrode 2 is a front side electrode of TCO and the photoactive layer sequence 3 is a sequence of p-doped, intrinsic and n-doped amorphous or microcrystalline silicon. The front side electrode 2 and the photoactive layer sequence 3 can be applied in successive vacuum coating processes without having to remove substrate 1 from the vacuum for this. It is also possible to start with a substrate 1 that has already been provided with a TCO layer as front side electrode 2. In this case only the photoactive layer sequence 3 needs to be applied.

Figure 2B:
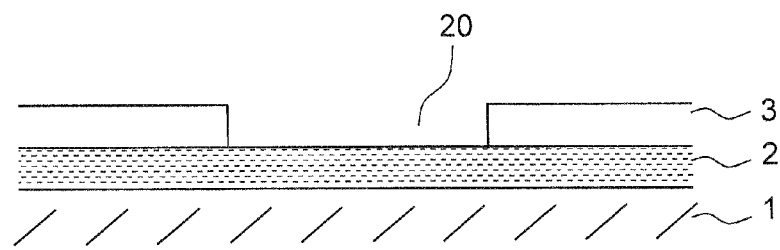

After removing substrate 1 from the vacuum there follows a first structuring step, in which the photoactive layer sequence 3, for the formation of a separating line 20, is interrupted to a width of >100 µm and typically 150 µm. This can take place, for example, by introducing laser radiation at a wavelength of 532 nm either from the layer side or through the substrate 1. The resulting layer structure is schematically shown in FIG. 2b.

Figure 2C:
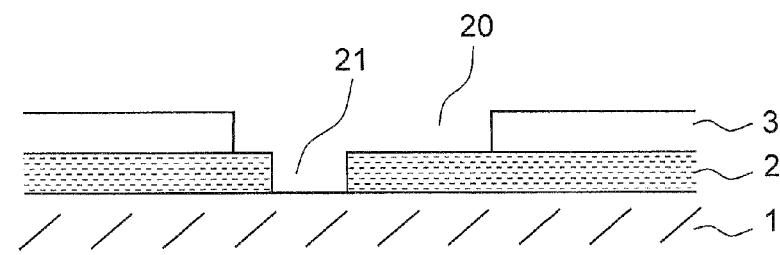

Then an additional separating line 21 is produced within the region of separating line 20; it interrupts the front side electrode 2 on a width of typically 10-40 μm (see FIG. 2c). Laser radiation at a wavelength of 1046 nm or 355 nm is suitable for formation of the separating line 21. It is advantageous for the separating line 21 not to be centrally positioned with respect to separating line 20, but rather to be offset in the left hand region of separating line 20, so that the left edges of separating line 20 and 21 are laterally spaced from each other about 20-30 μm. Like separating line 20, separating line 21 can be generated by means of laser radiation, which is directed from the layer side or from the substrate side.

Here it is preferred that the laser radiation needed to form separating lines 20 and 21 be provided from a single process head, which moves over substrate 1, so that positioning of the two separating lines 20 and 21 with respect to each other that is as precise as possible and constant over the entire length of the separating lines is guaranteed.

Figure 2D:
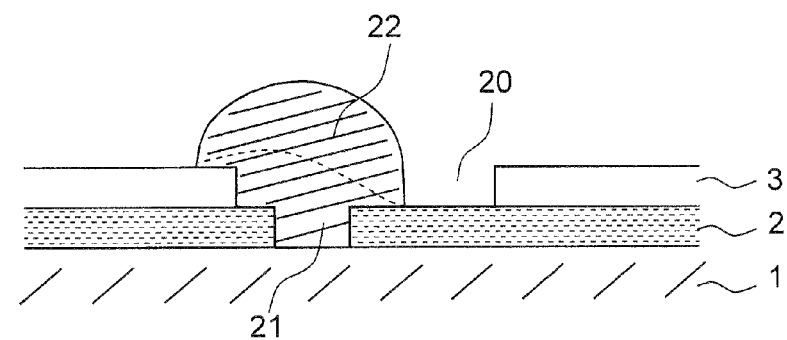

Then, as shown in FIG. 2d, an isolating line 22, like an electrically isolating strand, is applied along the separating line 21. Advantageously, the isolating line 22 fills separating line 21 and projects about 20-30 μm on both sides into separating line 20, so that the left edge of separating line 20 becomes isolated and passivated. However it is important that a sufficient region of the front side electrode 2 in separating line 20, typically 20-50 μm wide, is not covered by isolating line 22. The height of the isolating line 22 can typically be 5-50 μm.

An ink jet printing process is especially suitable for application of the isolating line 22. An electrically isolating polymer that hardens after application can be used as the isolating material.

The height to width ratio of isolating line 22 can be determined both by the technique of application of the isolating material and its flow properties. Preferably a surface that is free of edges and cross sections that run perpendicular to the substrate should preferably be formed, so that it can then be readily covered over by the subsequently applied back side contact 4. In FIG. 2d, for example, a rather high round profile is shown and, as an alternative, a flat profile of isolating line 22 is shown as a dotted line.

Figure 2E:
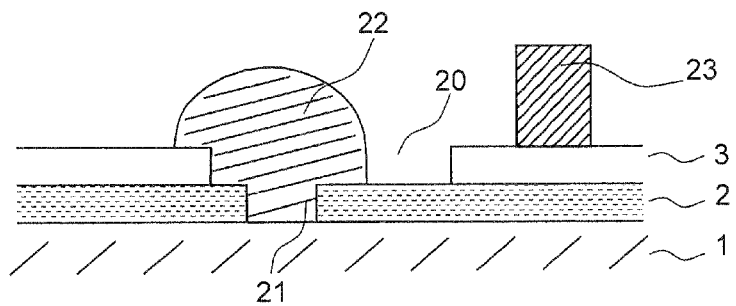

In addition, in a region to the right of separating line 20 on the photoactive layer sequence 3, a cover line 23 of a soluble lacquer is likewise applied in strand form over the entire width of substrate 1 (FIG. 2e). Again an ink jet printing process is suggested for this. A profile that is as box shaped as possible is advantageous for cover line 23, as is shown in idealized form in FIG. 2e. The width of cover line 23 is typically 50 μm and the distance of the line to the right edge of separating line 20 should be about 20-50 μm. The height of cover line 23 is not critical, but it should be greater than the thickness of the back side electrode 4, which is still to be applied. It is advantageous to apply both the isolating line 22 and the cover line 23 with the same process head from the layer side. It is also conceivable that all of the structuring steps, thus the radiation with laser light to form separating lines 20 and 21 and the application of isolating line 22 and cover line 23, take place from a single process head, which operates from the layer side. In this way the relative positioning of all of the structuring elements with respect to each other is ensured as well as possible. If the isolating line 22 and cover line 23 are applied by a separate process head after laser structuring, this second process head can be connected to an optical detection system through which the position of the process head is tracked from the detected position of separating lines 20 or 21.

Figure 2F:
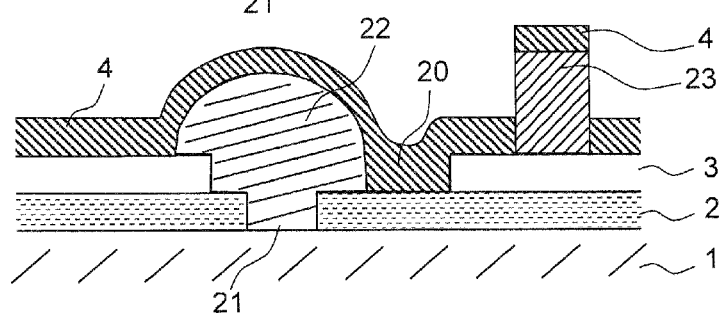

As shown in FIG. 2f, this is followed by the application of the back side electrode 4, for example a ZnO layer, followed by an Ag and/or Al layer in a vacuum deposition process or possibly in a spray coating process. The different profiles of the isolating line 22 on the one hand and the cover line 23 on the other lead to the isolating line 22 being covered over by a continuous layer, whereas the sides of the cover line 23 are not or are only incompletely covered over by the back side electrode 4.

Then the soluble varnish of cover line 23 is removed by a suitable solvent, so that the separating line 24 remains in the back side electrode 4. The application of the cover line 23 to this extent is a structuring process for a still to be applied layer (in this case the back side electrode 4).

Figure 2G:
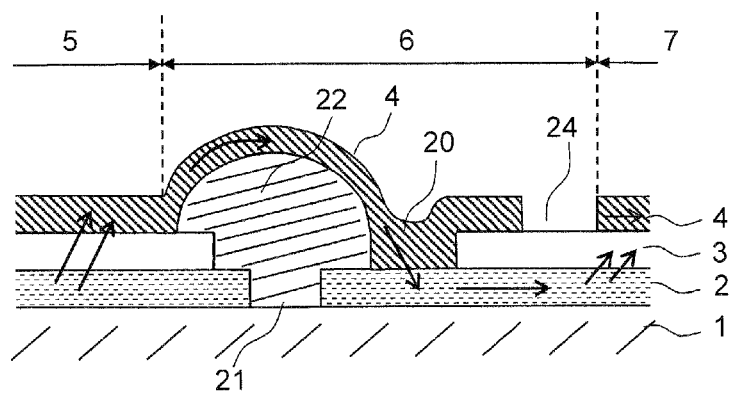

The process results in the thin layer solar cell module shown in FIG. 2g. The resulting segmentation into a first segment 5 on the left, a second segment 7 on the right and the contact region 6 lying between them is shown in the schematic representation. In addition, arrows symbolizing the flow of current illustrate the series connection of segments 5 and 7 that has taken place.

The thin layer solar cell module is characterized by the isolating line 22 that is covered over by the back side electrode 4 and completely enclosed by it. The typical dimensions and spacings of the structuring elements indicated in the previous description can lead to a width of the contact region that is less than 200 μm, which results in efficient utilization of the area of the thin layer solar cell module.

Figure 2H:
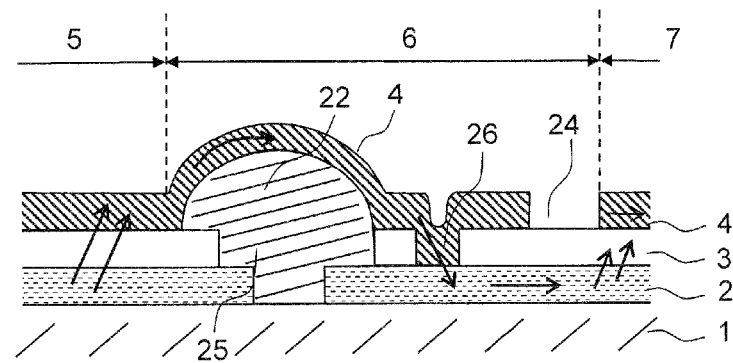

FIG. 2h shows an alternative embodiment of the thin layer solar cell module. In this embodiment the separating line 20 was not made over the entire width indicated in connection with FIG. 2b. Rather, a narrower separating line 25 was formed, in which the separating line 21 in this case was made centrally positioned and an additional separating line 26 was formed. This division into two separating lines that interrupt the photoactive layer sequence 3 can be advantageous from the standpoint of process technology, since all in all a lesser width must be removed and correspondingly a lower laser power is required.

An advantage of the process shown in FIG. 2 is that two layers or layer sequences (see FIG. 2a) are applied before a first structuring step is carried out. The number of transfers between different process stations and the number of loading and unloading operations into the vacuum that is necessary for application of the layers can be kept low. In addition, all of the structuring steps can be carried out grouped in succession in one process station, so that a reorientation of the substrate 1 before each structuring step is no longer necessary. Optionally it is even possible to carry out all of the structuring steps quasi-simultaneously using one process head. To increase throughput in structuring, moreover, a number of these process heads can be used parallel and side by side to process the contact regions between different segments. These process heads can be outfitted with separate lasers or can be supplied by separate lasers, or can be supplied from a common laser whose light is sent to the different process heads by beam splitters.

In a manner analogous to FIG. 2, FIG. 3 shows another example of an embodiment of a process in accordance with the application. The statements about possible materials made in connection with FIG. 2 can be extended to this embodiment example.

Figure 3A:
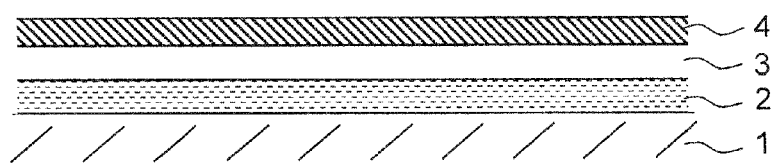
Figure 3B:
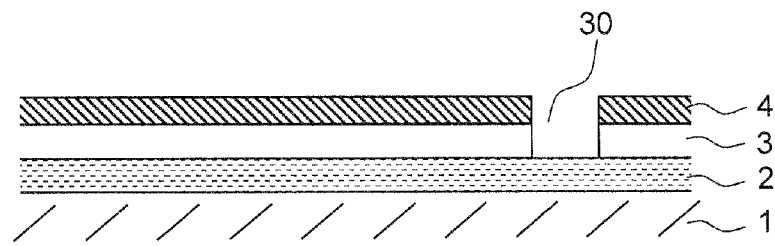

As FIG. 3a shows, in this case the front side electrode 2, the photoactive layer sequence 3 and the back side electrode 4 are applied to the substrate 1 before a first structuring step subsequently takes place. As shown in FIG. 3b, a separating line 30 is introduced into the photoactive layer 3 and back side electrode 4 as the first structuring step. As described in connection with the separating line 12 in FIG. 1, the separating line 30 can be formed by radiation with laser light of appropriate wavelength, for example 532 nm.

Figure 3C:
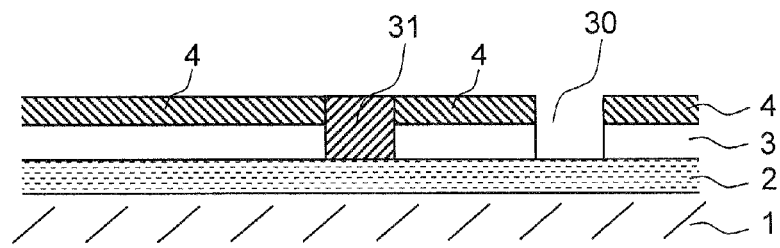
Figure 3D:
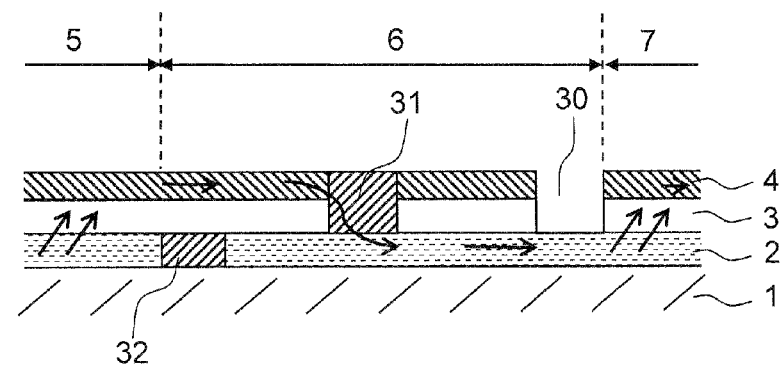

Then the contact line 31 shown in FIG. 3c is created. By radiation with laser light of appropriate wavelength from a range of, for example, 200 nm to 10 µm, from the layer side the back side electrode 4 and photoactive layer 3 are melted in a locally limited manner, but not evaporated. It is likewise possible to direct the laser light from the substrate side. In this case wavelengths of about 300 nm to 2 µm, for example, are suitable.

Either a silicide, for example, AgAlSi with quasi-metallic conductivity, or an eutectic of Si and Ag, which likewise has high conductivity, forms due to diffusion processes in the melt. Because of this, current can flow from the back side electrode 4 to the front side electrode 2 at this place. Preferably, in the region of the contact line 31 there is ohmic contact to the front side electrode 2. The process for formation of the contact line 31 is not restricted to the material system indicated in the embodiment example. The mixture of elements from the photoactive layer 3 and the back side electrode 4 in the locally formed melt can also be used with other systems to form a conductive material compound or alloy.

Then, to the left of separating line 31, a separating line 32 is formed to interrupt the front side electrode 2. To form separating line 32 laser light at a wavelength that is absorbed in the front side electrode 2, for example, 1064 nm, is introduced through the substrate 1. The laser power and processing time are chosen so that the front side electrode 2 becomes locally heated and stimulated to recrystallization processes without the material being physically removed. In contrast to the separating lines 20 and 21 described in connection with FIG. 2 or the separating line 30 in this embodiment example, in the case of separating line 32 material therefore is not removed, but rather only its properties are changed, in particular, its conductivity. A gap is not formed. The layers lying on top of the front side electrode 2, the photoactive layer 3 and the back side electrode 4 are not or are only negligently affected. Here it is advantageous to use pulsed laser radiation, through which a brief heating of the front side electrode 2 can be achieved locally before the introduced amount of heat dissipates into the surroundings. In this way a high temperature level can be briefly achieved locally without the surroundings becoming significantly heated. Pulse durations that are less than a microsecond and preferably that lie in the range of nano- or picoseconds are especially suitable here. The change of microstructure of the TCO material of the front side electrode 2 in the region of separating line 32 caused by this leads to a clear decrease of its conductivity in this region. The reason is that dopants are essentially responsible for the conductivity of TCO layers and they are no longer incorporated in the crystal as a consequence of the recrystallization process. A second possible mechanism that leads to a drop of the conductivity is achieved by mixing the material of the front side electrode 2 with the material of the overlying photoactive layer sequence 3. The oxygen of the TCO material of the front side electrode 2 forms an electrically isolating silicon oxide (SiO or $SiO_2$) with the silicon of the photoactive layer sequence 3. This operation is decisively affected by the high enthalpy of oxide formation of silicon. Here it can be advantageous to choose the parameters for the laser radiation (wavelength, power, pulse duration) so that the photoactive layer sequence 3 lying over the front side electrode 2 also becomes heated. It is also conceivable to use laser radiation at two wavelengths at the same time, one of which is preferably absorbed in the front side electrode 2 and the other is preferably absorbed in the photoactive layer sequence 3. However, again no material is removed. The back side electrode 4 should not be changed, so that the flow of current from the first segment 5 through contact region 6 into the second segment 7 at the right is not adversely affected.

In both cases (separation of dopants; silicon oxide formation) the front side electrode 2 is electrically interrupted or its conductivity is sufficiently reduced. This process for formation of separating line 32 is also not restricted to the material system indicated in the embodiment example. For example, in the case of CI(G)S-based photoactive layer sequences 3, Cu oxides, or in the case of photoactive layer sequences 3 that contain Cd, Cd oxides are formed in the separating line 32 and these electrically interrupt the front side electrode 2 or sufficiently reduce its conductivity in the region of separating line 32.

The result is shown in FIG. 3d, in which again the regions of a first segment 5, a second segment 7 and the inbetween contact region 6 are represented and in which the flow of current in the series connection of segments 5 and 7 is symbolized by arrows. The resulting thin layer solar cell module is characterized by the silicon-containing contact line 31 in the back side electrode 4 and by the recrystallized or silicon oxide-containing separating line 32 in the front side electrode 2.

As with the first embodiment example, here too it is advantageous that all of the structuring steps be grouped together. In addition, at least two of the structuring measures, namely the creation of separating line 30 and contact line 31, which take place from the layer side, can be implemented by a single process head. The remaining structuring measures, the creation of separating line 32, can be implemented from the substrate side with the thin layer solar cell module in the same position by a second process head guided in parallel with the first process head. It is especially advantageous that all of the layers are applied before the group of structuring measures is carried out. To increase throughput in structuring, moreover, a plurality of process heads can also be used in parallel.

In an alternative embodiment of the process it is conceivable to start with a substrate 1 that has already been provided with a TCO layer as front side electrode 2 and in which the separating line 32 was already created in a traditional way. In this case the photoactive layer sequence 3 and back side electrode 4 are therefore applied to a prestructured front side electrode 2. Even though all of the structuring measures are thus no longer combined together, this process offers an advantage over the prior art, in which each layer deposition is followed by a subsequent structuring measure.

FIG. 4 shows two other embodiment examples of a process for producing thin layer solar cell modules.

Figure 4A:
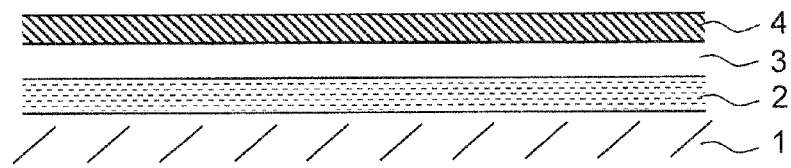
Figure 4B:
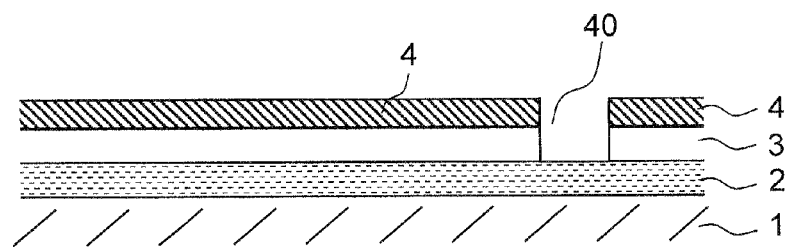
Figure 4C:
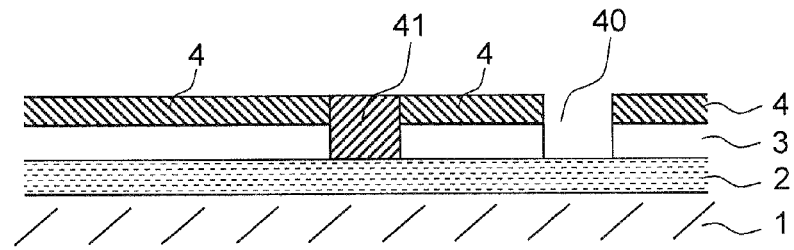

As in the embodiment example shown in FIG. 3, first a front side contact 2, a photoactive layer sequence 3 and a back side contact 4 are applied to a substrate 1 (FIG. 4a). Then a separating line 40 is made in the back side electrode 4 and the photoactive layer sequence 3 (FIG. 4b). Then a contact line 41 is formed between the back side electrode 4 and the photoactive layer sequence 3 is laterally spaced from separating line 40. Up to this process step the process runs exactly like the process presented in connection with FIG. 3, for which reason one is referred to the description given there for additional details.

Figure 4D:
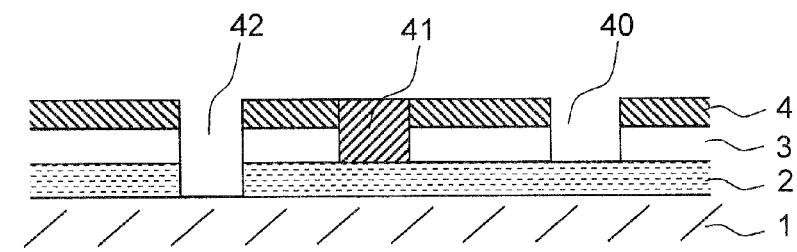

Then, as represented in FIG. 4d, a separating line 42 is created, which interrupts the entire layer structure except for the substrate, thus the front side electrode 2, photoactive layer sequence 3 and back side electrode 4. Separating line 42 can preferably be formed by radiation of laser light of a suitable wavelength (1064 nm or 355 nm) through the substrate. Alternatively, one can operate from the back side using higher radiation energy. It is conceivable that all of the layers are removed at the same time or that laser light of the same or different wavelengths is used for radiation in steps that follow one another, through which the layers are removed in a number of steps. For example, in a first step, as in the formation of separating line 40, the photoactive layer sequence 3 and a back side electrode 4 could be removed, and in a second step, as in the formation of separating line 10 (see FIG. 1) or separating line 20 (see FIG. 2), the front side electrode 2 could be removed.

Finally, an electrically conductive adhesive strip 43 is applied over separating line 42, due to which the undesired interruption of the back side electrode 4 by separating line 42 is electrically reclosed. The electrically conductive adhesive strip 43 can, for example, consist of a conductive polymer. When applying it, care is to be taken that the adhesive strip 43 not be laid over separating line 40, the purpose of which is precise electrical separation of the back side electrodes 4 of adjacent segments 5 and 7. The spacing of separating lines 40 and 42 is about 100 μm. However, laying adhesive strip 43 with such positioning precision is technical feasible. It is not necessary for the conductive adhesive strip 43 to be applied over the entire width of the thin layer solar cell module. It is enough if segments of the conductive adhesive strip 43 that are distributed over the width are present as current bridges.

Figure 4E:
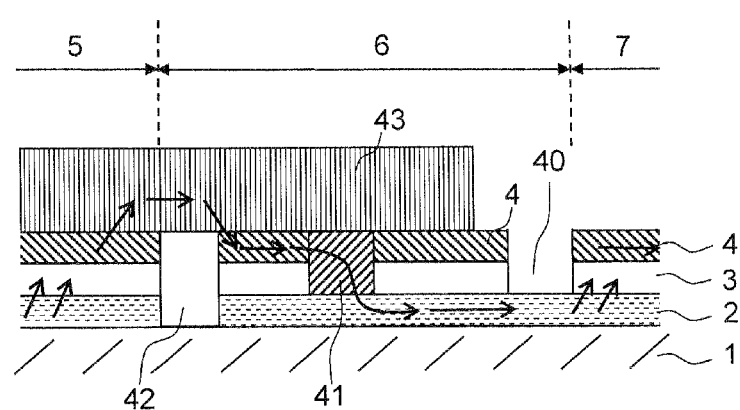

The thin layer solar cell module that results from this production process is depicted in FIG. 4e. Again the adjacent segments 5 and 7 and the inbetween contact region 6 are entered and the current flow of series connection of the segments is symbolized by arrows.

Figure 4F:
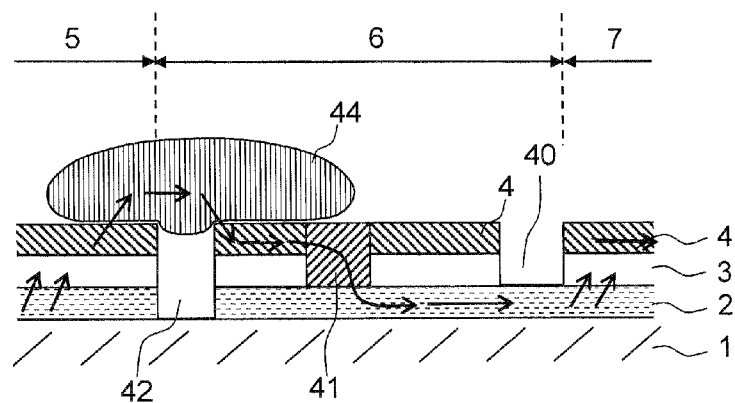

An alternative method for connecting the back side electrode 4 that has been separated by separating line 42 is shown in FIG. 4f. Instead of adhesive strip 43 a conductive strand 44 of a conductive paste is applied; the consistency of the paste is chosen so that it does not or only negligibly penetrates into separating line 42. The application of the conductive paste, which can be a hardening conductive polymer, can take place by ink jet printing technology. As in the case of the conductive adhesive strip it is not necessary for the conductive strand 44 to be continuous over the width of the module, even though if there is such a continuous embodiment better electrical connection and protective sealing of separating line 42 are obtained as advantages.

The thin layer solar cell modules that result from these two process alternatives are characterized by the silicide-containing contact line 41 and the adhesive strip 43 or adhesive strand 44 applied to the back side electrode 4.

Figure 5:
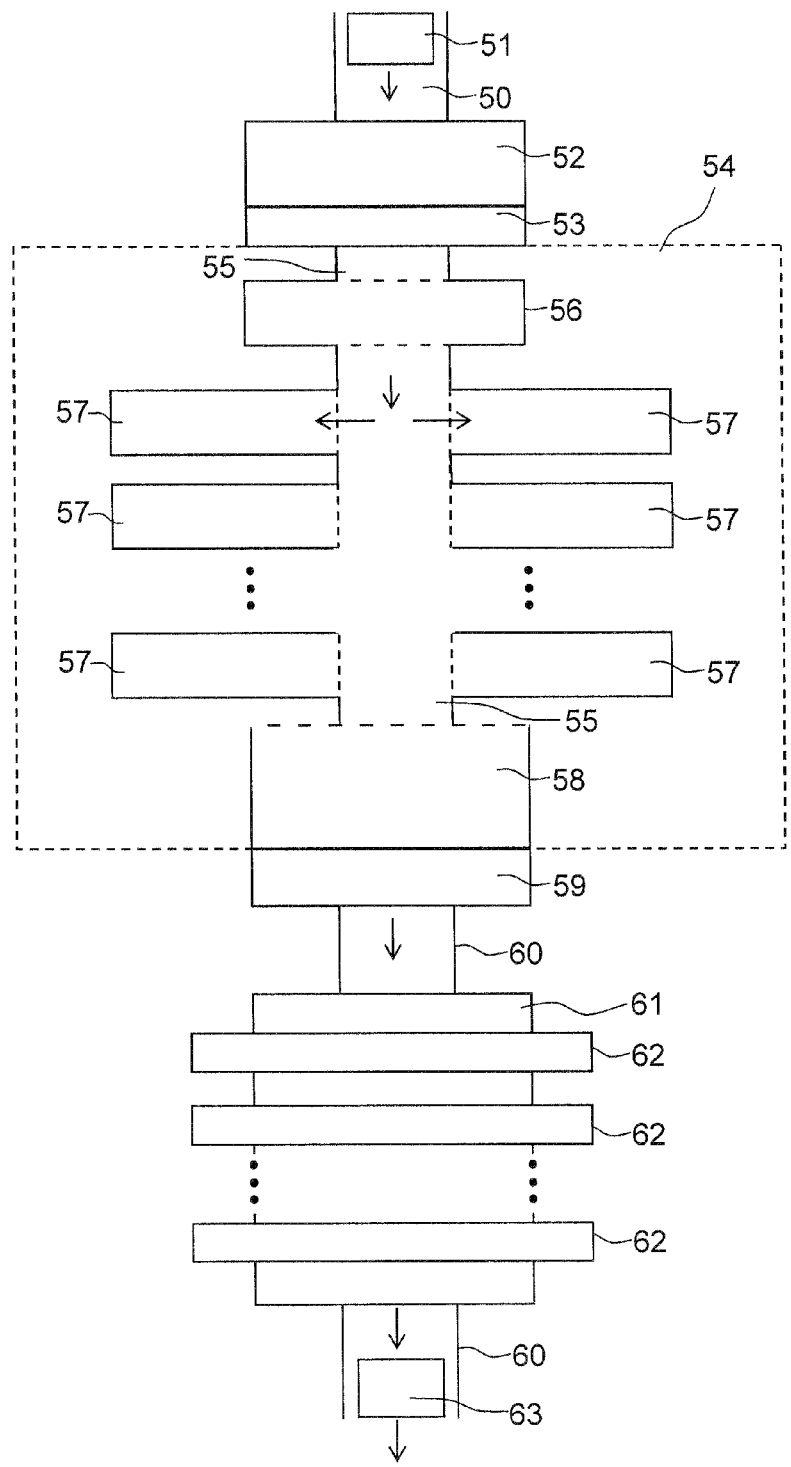
FIG. 5 shows a plant for production of thin layer solar cell modules.

FIG. 5 shows a production line as a suitable apparatus for conducting the production process for thin layer solar cell modules in accordance with the application.

The production line has a first transport system 50 for acceptance of a glass substrate 51. The transport system 50 leads into a cleaning station 52, which is connected via a first vacuum lock 53 to a coating device 54. The coating device 54 has a second transport system 55, a first PVD/(LP)CVD coating station 56, a plurality of PECVD coating stations 57 and a second PVD/(OP)CVD coating station 58. Connected to the second PVD/(LP)CVD coating station 58 is a second vacuum lock 59, from which a third transport system 60 emerges. This third transport system 60 leads to a structuring device 61, which has several movable process heads 62. After passing through the structuring device 61 on the third transport system 60 a finished thin layer solar cell base module 63 leaves the production line.

The starting point of production of a thin layer solar cell module in the presented production line is the glass substrate 51 which is delivered by the first transport system 50. Preferably, the production line is designed so that flat glass sheets of the conventional width of 3.21 meters can be accommodated and processed. In the event the production line can also preferably be directly coupled to a sheet glass production line. After cleaning in cleaning station 52 the glass substrate 51 is delivered directly to the first vacuum lock 53 without contact with the surrounding atmosphere. For this reason one can omit a clean room environment for protection against dust particles.

The electrode can be applied in the subsequent first PVD/(LP)CVD coating station 56. In a CVD (chemical vapor deposition) coating a low pressure process (LPCVD—low pressure CVD) can be used. In addition, a (dry) etching device can be integrated into the first PVD/(LP)CVD coating station 56. Preferably, the first PVD/(LP)CVD coating station 56 operates in a continuous (in-line) process.

After that a photoactive layer sequence can be applied in the different PECVD coating stations 57. Preferably, these PECVD coating stations 57 are designed as stationary coating stations. Alternatively, the electrode can also be applied in a stationary process in one of these stations. In the event the first PVD/(LP)CVD coating station 56 could be omitted. In addition, there is also the possibility that the glass substrate 51 already has a front electrode, for example, due to on-line coating in the glass manufacturer's production line. In the event the first PVD/(LP)CVD coating station 56 could also be omitted. It is further conceivable that if the front side electrodes are produced in a PVD coating process a connected (dry) etching process is used for the required roughening of the front electrode. The corresponding process station is either integrated into the first PVD/(LP)CVD coating station 56 or into one of the PECVD coating stations 57. Because of the arrangement of the coating stations 56, 57 and 58 an inexpensive linear roller drive can serve as the second transport system 55 in the vacuum of the coating plant 54.

To produce Si tandem cells, hydrogen-terminated amorphous p-, i- and n-doped a-Si:H layers and/or microcrystalline p-, i- and n-doped Si layers and/or other absorber layers based on a-Si(Ge):H can be applied in succession by the PECVD coating stations 57. Moreover, the production line is laid out so that the glass substrate passes through the second PVD/(LP)CVD coating stations 58 after the PECVD coating stations 57 without breaking the vacuum, and the metal layer of a back side electrode is applied, for example, in a sputtering process. Again the second PVD/(LP)CVD coating station 58 is preferably laid out as an in-line station for a continuous coating process and can operate in a low pressure process in the case of a CVD coating. It is also conceivable for there to be a plurality of second PVD/(LP)CVD coating stations 58 in order to be able to deposit different metals, for example, Ag and/or Al and/or Mo.

Then the glass substrate 51 is removed from the vacuum through the second vacuum lock 59 and, on the third transport system 60, passes through the structuring device 61 of the production line.

Correspondingly, the indicated production line can also be used to produce thin layer solar cell modules based on compound semiconductors (CdTe, CIS).

The processes described in connection with FIGS. 2-4 are characterized by the fact that grouping into process steps for layer deposition and process steps for structuring, i.e., for formation of the separating, isolating, cover and contact lines, is possible. This is reflected in the combining of the process stations needed for deposition of the layers in the coating device 54 and the combining of the structuring tools needed for structuring in the structuring device 61. Lasers, laser transmission optics, ink jet printing heads and devices for application of adhesive strips can be used as structuring tools. Here it is advantageous to integrate as many as possible of the structuring tools that are required for related process steps into one process head 62. This applies, for example, to lasers of different wavelength, which create different separating lines, ones which are to be positioned as precisely correctly with respect to each other. In this connection one is also directed to the remarks concerning FIGS. 2-4 with relevance to the advantageous embodiments of the process heads. A plurality of identical process heads 62, with which different parallel regions of a glass substrate 51 can be processed, can be present in order to increase throughput.

If application of the back side electrode 4 is still necessary after the substrate has left the structuring device 61, for example, to produce the thin layer solar cell module described in connection with FIG. 2, the second PVD/(LP)CVD coating station 58 can optionally be separately implemented instead of being integrated into the coating device 54. The combining of the PECVD coating stations 57 and the first PVD/(LP) CVD coating station 56 into the coating device 54 is not affected by this.

Then one has the finished thin layer solar cell base module 63. Subsequently only peripheral processing steps like encapsulation, stripping the edges, adding connections, etc., for the final preparation of the thin layer solar cell module are necessary. These steps can be carried out independently outside of the production line or can also be integrated into the production line.

What is claimed is:

1. A process for producing a thin layer solar cell module with a plurality of segments that are electrically connected in series and arranged on a common substrate, the process comprising:
    applying layers to the substrate to form at least one electrode and one photoactive layer sequence;
    structuring the applied layers to form the plurality of segments,
    wherein the at least one electrode and the one photoactive layer sequence are applied before the structuring is carried out and wherein structuring the applied layers comprises creating a contact line by directing laser light so that the at least one electrode and the one photoactive layer sequence become locally heated and a material compound is formed that is electrically conductive; and
    wherein the substrate is already provided with an electrode in which a separating line was already created and the photoactive layer sequence and the at least one electrode are applied to the pre-structured electrode.

2. A process for producing a thin layer solar cell module with a plurality of segments that are electrically connected in series and arranged on a common substrate, the process comprising:
    applying layers to the substrate to form at least one electrode and one photoactive layer sequence and a further electrode such that the photoactive layer sequence is arranged between the electrode and the further electrode; and
    structuring the applied layers to form the plurality of segments;
    wherein the at least one electrode, the one photoactive layer sequence and the further electrode are applied before the structuring is carried out; and
    wherein structuring the applied layers comprises:
        creating a separating line by laser radiation and/or by mechanical scoring and/or by selective etching; and
        creating an isolating line from an electrically isolating material within the separating line.

3. The process according to claim 2, wherein laser light is directed so that one or more layers are locally removed.

4. The process according to claim 2, wherein the isolating line is applied by an ink jet printing process.

5. The process according to claim 2, wherein the process is performed on a production line that comprises a coating device with a first vacuum lock, at least two coating stations and a second vacuum lock, wherein, after being loaded in the coating device, the substrate passes through the first vacuum lock, the at least two coating stations in succession under vacuum conditions and then is unloaded from the coating device through the second vacuum lock.

6. A thin layer solar cell module with a plurality of segments that are electrically connected in series, which is produced by a process according to claim 2.

7. The process according to claim 6, wherein the thin layer solar cell module is processed using a structuring device that includes a movable process head with a plurality of different structuring tools available for structuring a plurality layers of the thin layer solar cell module.

8. The process according to claim 7, wherein the movable process head is equipped to make available laser radiation simultaneously at least two different wavelengths.

9. The process according to claim 7, wherein the movable process head is equipped to apply a conductive paste.

10. The process according to claim 7, wherein the movable process head is equipped to make available laser radiation and has an ink jet printing device.

11. A process for producing a thin layer solar cell module with a plurality of segments that are electrically connected in series and arranged on a common substrate, the process comprising:
    applying layers to the substrate to form at least one electrode and one photoactive layer sequence and a further electrode such that the photoactive layer sequence is arranged between the electrode and the further electrode; and
    structuring the applied layers to form the plurality of segments,
    wherein the at least one electrode, the one photoactive layer sequence and the further electrode are applied before the structuring is carried out; and
    wherein structuring the applied layers comprises:
        creating a separating line by laser radiation and/or by mechanical scoring and/or by selective etching, the separating line interrupting the at least one electrode, the one photoactive layer sequence and the further electrode, and
        applying a conductive paste over the separating line.

12. The process according to claim 11, wherein laser light is directed so that one or more layers are locally removed.

13. The process according to claim 11, wherein the conductive paste is applied by an ink jet printing process.

14. The process according to claim 11, wherein the process is performed on a production line that comprises a coating device with a first vacuum lock, at least two coating stations and a second vacuum lock, wherein, after being loaded in the coating device, the substrate passes through the first vacuum lock, the at least two coating stations in succession under vacuum conditions and then is unloaded from the coating device through the second vacuum lock.

15. A thin layer solar cell module with a plurality of segments that are electrically connected in series, which is produced by a process according to claim 11.

16. The process according to claim 11, wherein the thin layer solar cell module is processed using a structuring device that includes a movable process head with a plurality of different structuring tools available for structuring a plurality layers of the thin layer solar cell module.

17. The process according to claim 16, wherein the movable process head is equipped to make available laser radiation simultaneously at least two different wavelengths.

18. The process according to claim 16, wherein the movable process head is equipped to apply the conductive paste.

19. The process according to claim 16, wherein the movable process head is equipped to make available laser radiation and has an ink jet printing device.

* * * * *